United States Patent

Slavin

[11] Patent Number: 6,088,388
[45] Date of Patent: Jul. 11, 2000

[54] DIGITAL FIR FILTERS FOR COMPENSATION OF NYQUIST SLOPE IN PSEUDO-SYNCHRONOUS DEMODULATORS

[75] Inventor: Keith R. Slavin, Beaverton, Oreg.

[73] Assignee: Tektronix, Inc., Beaverton, Oreg.

[21] Appl. No.: 08/931,409

[22] Filed: Sep. 16, 1997

[51] Int. Cl.[7] ........................................... H03H 7/30
[52] U.S. Cl. ..................... 375/229; 348/725; 375/350
[58] Field of Search .................... 375/229, 285, 375/350, 232; 333/18, 28 R; 364/724.19, 724.2; 348/607, 725

[56] References Cited

U.S. PATENT DOCUMENTS

| | | | |
|---|---|---|---|
| 4,227,160 | 10/1980 | Tamori et al. | 333/18 |
| 4,359,778 | 11/1982 | Lee | 375/229 |
| 4,638,495 | 1/1987 | Mizoguchi | 333/18 |
| 4,785,441 | 11/1988 | Thompson et al. | 364/724.19 |
| 5,191,334 | 3/1993 | Yasuda | 341/61 |
| 5,243,431 | 9/1993 | Inagaki | 348/738 |
| 5,331,416 | 7/1994 | Patel et al. | 348/614 |
| 5,471,411 | 11/1995 | Adams et al. | 364/724.1 |
| 5,642,382 | 6/1997 | Juan | 364/724.2 |

*Primary Examiner*—Tesfaldet Bocure
*Attorney, Agent, or Firm*—Francis I. Gray

[57] ABSTRACT

A digital finite impulse response (FIR) filter for compensation of Nyquist slope in a pseudo-synchronous demodulator has a plurality of individual FIR filters coupled in series, having a bandpass filtered intermediate frequency video signal as an input and providing a broadband video signal as an output. The individual FIR filter amplitude responses represent each product term of the following polynomial:

$$A(\omega)=2(1+x)(1+x^2) \ldots (1+x^{2^{(F-1)}})$$

where F is the number of individual FIR filters in the series and $x=(\omega_m-\omega)/\omega_t$, $\omega_m$ being the modulation frequency and $\omega_t$ being a deviation frequency. The register delay value for each of the individual FIR filters is obtained heuristically to achieve optimum quality as a compromise between performance and hardware complexity, and the number of individual FIR filters is determined by convolving each individual FIR filter with prior individual FIR filters in the series until the overall performance meets frequency response requirements.

3 Claims, 4 Drawing Sheets

$$A\,[w] = [\quad b\quad ] \cdot \begin{bmatrix} h \end{bmatrix}$$

$$\begin{bmatrix} A \end{bmatrix} = \begin{bmatrix} B \end{bmatrix} \cdot \begin{bmatrix} h \end{bmatrix}$$

with dimensions $u+1$ (width of B) and $u+1$ (height of h)

DIGITAL FIR FILTERS FOR COMPENSATION OF NYQUIST SLOPE IN PSEUDO-SYNCHRONOUS DEMODULATORS

CROSS-REFERENCE TO RELATED INVENTIONS

Not applicable

STATEMENT REGARDING FEDERALLY SPONSORED RESEARCH OR DEVELOPMENT

Not applicable

BACKGROUND OF THE INVENTION

The present invention relates to digital filters, and more particularly to digital finite impulse response (FIR) filters for compensation of the Nyquist slope in pseudo-synchronous demodulators.

If two arbitrary baseband sinusoids of frequencies $\omega_h$ (high frequency) and $\omega_l$ (low frequency)

$$V[t]=A \cos[\omega_h t]+B \cos[\omega_l t] \quad (1)$$

are modulated with another sinusoid at angular frequency $\omega_m$, $\sin[\omega_m t]$, the modulated signal, as shown in FIG. 1, is:

$$M[t]=A \sin[\omega_m t]+B \sin[\omega_m t] \cos[\omega_l t]=(A/2)(\sin[(\omega_m-\omega_h)t]+\sin[(\omega_m+\omega_h)t])+(B/2)(\sin[(\omega_m-\omega_l)t]+\sin[(\omega_m\omega_l)t]). \quad (2)$$

Using a highpass filter to remove the terms while passing the $(\omega_m-\omega_h)$ terms while passing the $(\omega_m+\omega_h)$ terms also provides 3 db down response at $\omega_m$ as shown in FIG. 2 and, since $\omega_l$ is close to zero, B is halved and $\sin[\omega_m-\omega_l t]$ is approximately equal to $\sin[[(\omega_m+\omega_l]$. Multiplying by two produces the final modulated signal:

$$M[t]=A \sin[(\omega_m+\omega_h)t]+B \cos[\omega_l t] \sin[\omega_m t]. \quad (3)$$

In other words the low frequency input at frequency $\omega_l$ passes through without a quadrature component.

In a synchronous demodulation system the modulated signal is remodulated with $\sin[\omega_m t]$:

$$M[t] \sin[\omega_m t]=A \sin[(\omega_m+\omega_h)t] \sin[\omega_m t]+B \cos[\omega_l t] \sin[\omega_m t]^2=$$

$$(A/2)(\cos[(\omega_m\omega_h)t-\omega_m t]-\cos[(\omega_{m+\omega h})t+\omega_m t]+B \cos[\omega_l t](1/2)(1-\cos[2\omega_m t])=$$

$$(A/2)(\cos[\omega_h t]-\cos[(2\omega_m\omega_h)t]+(B/2)(\cos[\omega_l t](1-\cos[2\omega_m t])4)$$

After filtering and removing components near and above $2\omega_m$, and scaling by two, the synchronous in-phase component is:

$$Is[t]=A \cos[\omega_h t]+B \cos[\omega_l t]=V[t] \quad (5)$$

which is the original signal.

Now demodulating synchronously in quadrature:

$$M[t] \cos[\omega_m t]=A \sin[(\omega_m+\omega_h)t] \cos[\omega_m t]+B \cos[\omega_l t] \sin[\omega_m t] \cos[\omega_m t]$$

$$=(A/2)(\sin[(\omega_m\omega_h)t-\omega_m t]+\sin[(\omega_m\omega_h)t+\omega_m t])+(B/2) \cos[\omega_l t](1-\cos[2\omega_m t])=$$

$$=(A/2)(\sin[\omega_h t]+\sin[(2\omega_m+\omega_h)t])+(B/2)(\cos[\omega_l t] \sin[2\omega_m t]6)$$

After filtering and removing components near and above $2\omega_m$, and scaling by two, the B term disappears and the quadrature component is:

$$Qs[t]A \sin[\omega_h t]=A \cos[\omega_h t-\pi/2] \quad (7)$$

resulting in no quadrature component for the low frequencies and a ninety degree phase lag at all higher frequencies with respect to $Is[t]$. This is undesirable, so two approaches have been used to address this problem.

Synchronous decoding requires using a phase-locked loop (PLL) to lock onto the demodulated signal above, which is extremely difficult due to the narrow bandwidth required. For video signals, as shown in FIG. 3, there are sync areas in which the higher frequency video components $\omega_h$ are absent, allowing a close approximation to the picture carrier $\omega_m$ to be obtained. This has the advantage of allowing the PLL bandwidth to be adjustable so that signal jitter may be observed. However obtaining very fast PLL response is difficult, given that the video sync tip occurs once per video line, approximately 15 kHz, and the PLL bandwidth has to be less than this, typically about 5 kHz. Thus the system does not give best demodulation results $$I(t)=\cos(\phi)Is(t)+\sin(\phi)Qs(t) \quad (8)$$

$$Q(t)=-\sin(\phi)Is(t)+\cos(\phi)Qs(t) \quad (9)$$

for signals with high-frequency jitter.

A pseudo-synchronous, or quasi-synchronous, demodulation technique using the side-band symmetry near the picture carrier $\omega_m$ applies a bandpass filter to the modulated signal around $\omega_m$, as shown in FIG. 4, such that A=0. Therefore for small $\omega_l$:

$$Is'(t)=B \cos[\omega_l t] \quad (10)$$

$$Qs'(t)=0 \quad (11)$$

and for a phase detection error $\phi$ $$I[t]=\cos[\phi]Is'[t] \quad (12)$$

$$Q[t]=-\sin[\phi]Is'[t] \quad (13)$$

This gives:

$$Is'[t]=Sqrt[I[t]^2+Q[t]^2] \quad (14)$$

so that:

$$\cos[\phi]=I[t]/Is'[t]=I[t]/Sqrt[I[t]^2+Q[t]^2] \quad (15)$$

$$\sin[\phi]=-Q[t]/Is'[t]=-Q[t]/Sqrt[I[t]^2+Q[t]^2] \quad (16)$$

$Is[t]$ and $Qs[t]$ are found in terms of $I[t]$, $Q[t]$, $\cos[(\phi]$ and $\sin[\phi]$ to get:

$$Is[t]=\cos[\phi]I[t]-\sin[\phi]Q[t] \quad (17)$$

$$Qs[t]=\sin[\phi]I[t]+\cos[\phi]Q[t] \quad (18)$$

which may be rewritten as:

$$Is[t]=(I[t]I[t]+Q[t])/Is'[t] \quad (19)$$

$$Qs[t]=(-Q[t]I[t]+I[t]Q[t])/Is'(t) \quad (20)$$

providing $Is[t]$ and $Qs[t]$, the synchronous in-phase and quadrature outputs as required.

The problem with this technique is that the Nyquist slope of the incoming signal, as shown in FIG. 5, is characterized by:

$$A[\omega] = 1 \qquad \omega >= (\omega_m + \omega_t) \qquad (21)$$

$$A[\omega] = (1 + (\omega - \omega_m)/\omega_t)/2 \quad (\omega_m - \omega_t) <= \omega <= (\omega_m + \omega_t)$$

$$A[\omega] = 0 \qquad \omega <= (\omega_m - \omega_t)$$

where $\omega_t$ is the deviation frequency (the angular frequency $\omega$ is related to frequency f in sampled systems by $\omega=2\pi f/f_s$ where $f_s$ is the sample frequency). For NTSC and PAL countries f is 0.75 and 1.0 Mhz respectively. Therefore a deviation from the center frequency of only a few percent makes the response of this system asymmetrical enough to distort the response on the assumption of a double-sideband signal.

Essentially the system becomes the sum of a double sideband system (the smallest sideband of frequency $\omega_m-\omega_t$ and $w_m+\omega_t$) with a single sideband system (the difference between the largest and smallest sidebands). If $\omega_t$ is positive, then $$A[\omega_m \omega_t]=1-\omega_t/\omega_t \qquad (22)$$

$$A[\omega_m \omega_t]=1+\omega_t/\omega_t \qquad (23)$$

so the double sideband component is $$\text{Double}[\omega_t]=1-\omega_t/\omega_t \qquad (24)$$

and the single sideband component is $$\text{Single}[\omega_t]=2\omega_t/\omega_t. \qquad (25)$$

Ideally a filter should maximize $\omega_t$ (thereby $\text{Double}[\omega_t]=1$ and $\text{Single}[\omega_t]=0$) by flattening the overall frequency response around $\omega_m$. The compensating filter is defined as the reciprocal of the signal response above (the region defining the response around $(\omega=\omega_m)$ $$A[\omega]=2/(1+(\omega-\omega_m)/\omega_t). \qquad (26)$$

However this filter has an infinite amplitude response around $\omega=(\omega_m-\omega_t)$, which is not possible with a finite impulse response filter (which gives the best performance in terms of the signal delay as a function of $\omega$). Therefore the active range of $\omega_t$ is limited to $\omega_m \pm \omega_d$, where $\omega^d < \omega_t$.

Thus the input to the compensation filter is limited so that the response outside of $\omega_m \pm \omega_d$ is rendered insignificant, and the filter, as shown in FIG. 6, is designed to give the desired response over the range $\omega_m \pm \omega_d$. The pre-filter that does the limiting is designed with well-known FIR filter design techniques. However traditional designs for the compensation filter often result in very ill-conditioned design equations that usually yield filters with large coefficients.

What is desired is a technique for designing digital FIR filters for compensation of Nyquist slope in pseudo-synchronous demodulators to obtain an approximately flat overall response over a narrow frequency range around the 1/2-amplitude response point of a Nyquist filter which reduces the ill-conditioned design problems, resulting in considerably less dynamic range requirement for the filter arithmetic.

BRIEF SUMMARY OF THE INVENTION

Accordingly the present invention provides a technique for designing digital Finite Impulse Response (FIR) filters for compensation of Nyquist slope in pseudo-synchronous demodulators that has a plurality of individual FIR filters coupled in series, having a bandpass filtered intermediate frequency video signal as an input and providing a broadband video signal as an output. The individual FIR filters represent the product terms of the polynomial:

$$A(\omega)=2(1+x)(1+x^2)\ldots(1+x^{2^{(F-1)}})$$

where F is the number of individual FIR filters in the series and $x=(\omega_m-\omega)/\omega_t$, $\omega_m$ being the modulation frequency and $\omega_t$ being a deviation frequency. The register delay value for each of the individual FIR filters is obtained heuristically to achieve optimum quality as a compromise between performance and hardware complexity, and the number of individual FIR filters is determined by convolving each individual FIR filter with prior individual FIR filters in the series until the overall performance meets frequency response requirements.

The objects, advantages and other novel features of the present invention are apparent from the following detailed description when read in conjunction with the appended claims and attached drawing.

DETAILED DESCRIPTION OF THE INVENTION

As described above, intermediate frequency (IF) demodulation of video often uses a Nyquist filter with the amplitude response indicated in Equation (21) above, with the modulation frequency $\omega_m$ being the video carrier frequency. For pseudo-synchronous demodulation the inverse filter around $\omega_m$ is given by Equation (26). The response goes to infinity as $\omega \rightarrow (\omega_m-\omega_t)$ and, since a symmetrical response is required around $\omega$ for double-sideband detection, in practice this limit cannot be approached using a FIR filter. However a FIR filter is preferred for correct demodulation phase around the transition region. Therefore, as indicated above, the response of the filter is limited to some range $\pm \omega_d$ around the picture carrier $\omega_m$.

The following identity is used to obtain a rapidly converging approximation to Equation (26):

$$1/(1-x)=\Pi_i=0\rightarrow\infty(1+x^{2^i}) \quad |x|<1 \qquad (27)$$

or for a finite number of product terms, F, $$A[\omega]=2(1+x)(1+x^2)(1+x^4)\ldots(1+x^{2^{(F-1)}}) \tag{28}$$

where:

$$x=(\omega_m-\omega)\omega_t. \tag{29}$$

Figure 1:
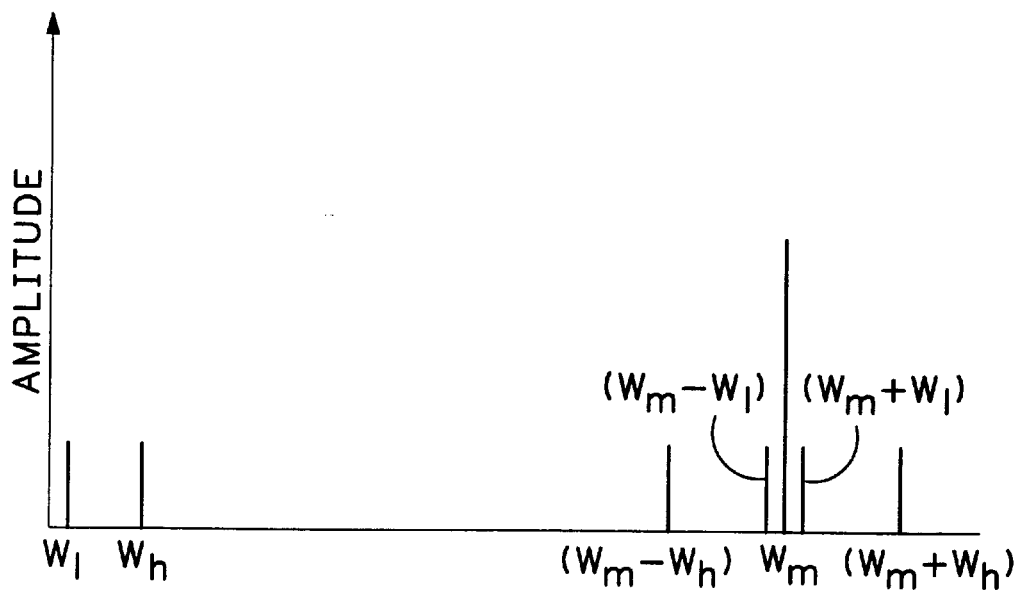
FIG. 1 is a frequency spectrum view of a modulated signal having high and low frequency components.
Figure 2:
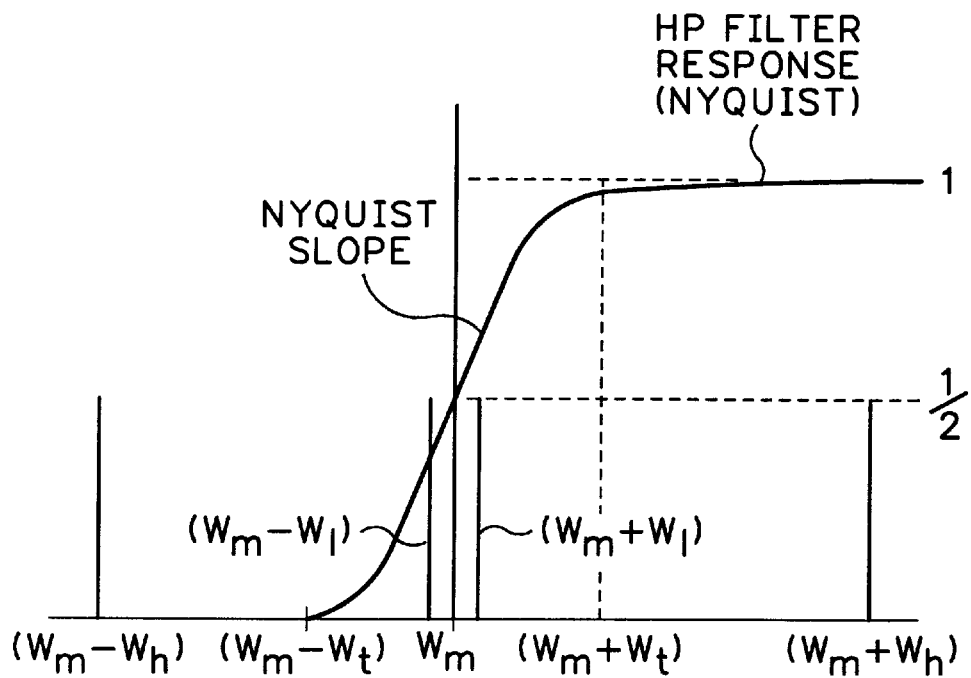
FIG. 2 is a frequency spectrum view of the modulated signal of FIG. 1 as Nyquist filtered by a highpass filter.
Figure 3:
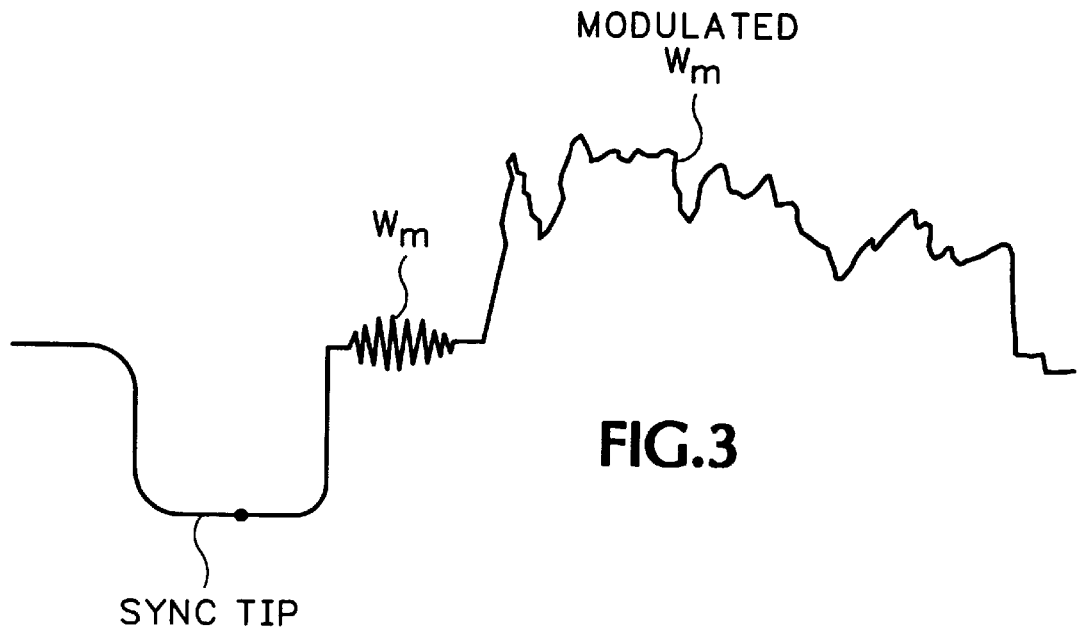
FIG. 3 is a waveform view of a portion of a video signal.
Figure 4:
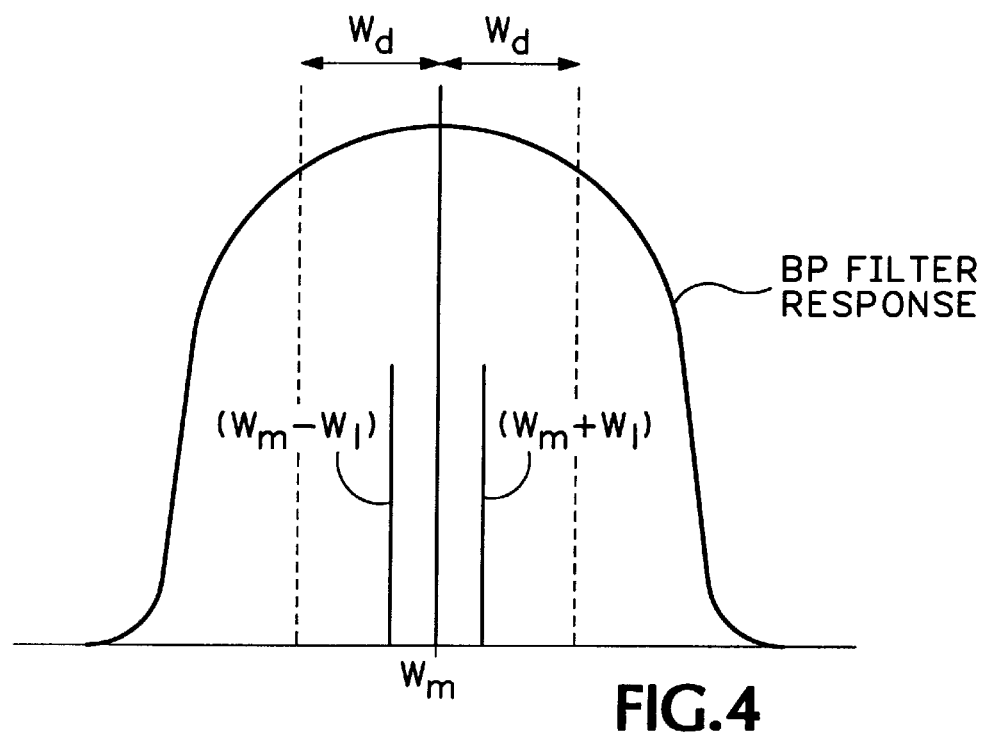
FIG. 4 is a portion of a frequency spectrum view of a bandpass filter response about a modulation frequency.
Figure 5:
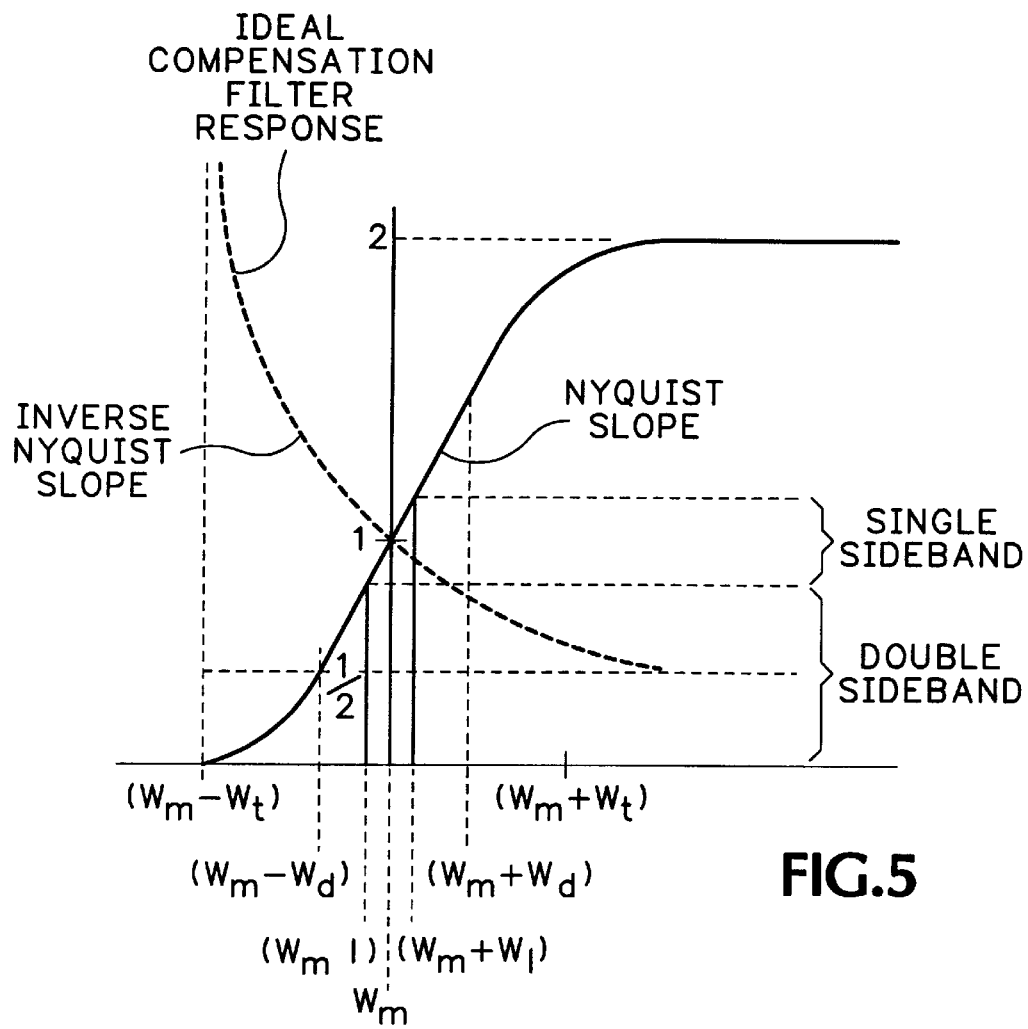
FIG. 5 is a detailed portion of the frequency spectrum view of FIG. 4 illustrating the double sideband and single sideband aspects of a demodulator about the modulation frequency.
Figure 6:
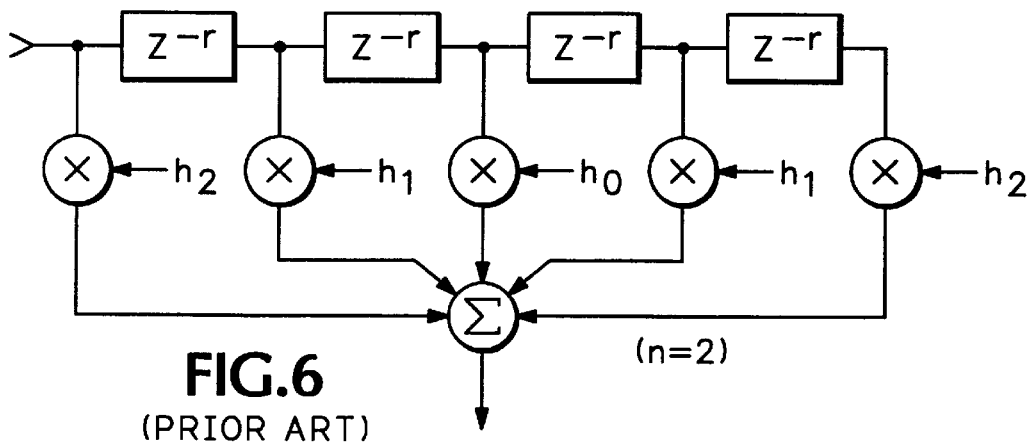
FIG. 6 is a block diagram view of a typical finite impulse response (FIR) filter according to the prior art.
Figures 7, 8, 9:
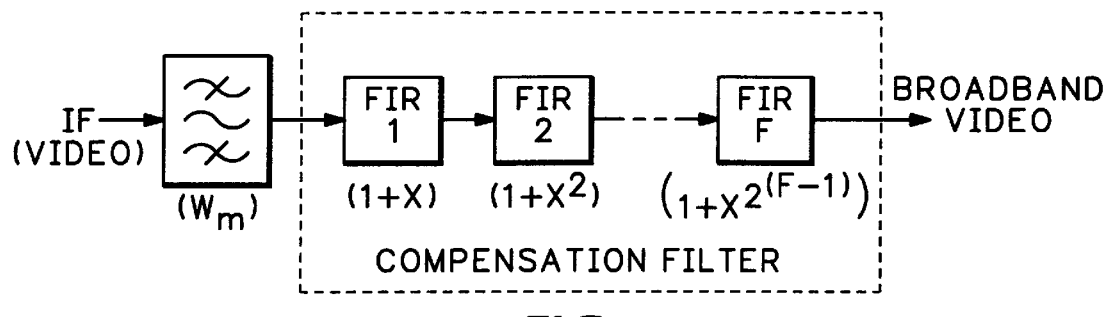
FIG. 7 is a block diagram view of a digital FIR filter for compensation of Nyquist slope according to the present invention.
FIG. 8 is a view of a matrix for determining FIR filter coefficients according to the present invention.
FIG. 9 is a view of a derivative matrix for the matrix of FIG. 8.

Now each term on the right side of Equation (28) may be implemented as a series of filters, as shown in FIG. 7, the first with a response (1+x), the second with a response of $(1+x^2)$, etc. The response of a length 2n+1 type 1 (odd length, even symmetry) FIR filter, where each tap is separated by r registers, i.e., z−>z in z-transform terms, is given by:

$$A[\omega]=h_0+2\Sigma_{i=1\to n}h_i \operatorname{Cos}(r\omega i). \tag{30}$$

This may be rewritten as shown in FIG. 8 to obtain the scalar $A[\omega]$ as the matrix product $$A[\omega]=b.h \tag{31}$$

where b is a single row matrix with n+1 columns $$b_0=1$$

$$b_j=2\operatorname{Cos}(rwj) 1<=j>=n \tag{32}$$

and h is the n+1 element column matrix of filter coefficients $h_0 \ldots h_n$ where $h_0$ is the center tap. For a polynomial of the form $1+x^u$, where $u=2^P$, as a general term in Equation (28), then all the derivatives at x=0, where $\omega=\omega_m$ from Equation (29), are given by:

$$\begin{aligned} d^i/d\omega^i(1+((\omega-\omega_m)/(-\omega_t))^u) &= 0 & i > u \\ &= u!/(-\omega_t)^u & i = u \\ &= 0 & 0 < i < u \\ &= 1 & i = 0 \end{aligned} \tag{33}$$

where $d^i/d\omega^i(f(\omega))$ is the ith derivative of $f(\omega)$. For a given {ur} the ith derivative of each side of Equation (31) for 0<=i<=u, remembering that the h vector is constant, forms the matrix equation shown in FIG. 9

$$A=B.h \tag{34}$$

where A is a column matrix of u+1 elements $$A[i]=d^i/d\omega^i(1+((\omega_m-\omega)/(\omega_t))^u) \tag{35}$$

which are obtained from Equation (33), and B is a rectangular matrix of u+1 rows, the first row(0) defined in Equation (32) and the corresponding ith derivative of row(0) on row(i) so that, if i is the row index and j the column index, then:

$$\begin{aligned} B[i,j] &= d^i/d\omega^i(2\operatorname{Cos}(r\omega j)) & j > 0 \\ &= 0 & i > 0, j = 0 \\ &= 1 & i = j = 0 \end{aligned} \tag{36}$$

Equation (33) shows that for one polynomial to be distinguished from another, the only difference is at the term where i=u, so that is as far as is needed to go to obtain a set of u+1 linear equations that can be solved. For a higher order polynomial filter to not generate error terms that interfere with the responses obtained from lower order polynomial filters, each set of equations for 0<=i<u must be satisfied as well. To find the coefficients h exactly, the B matrix is square, so n=u and the u+1 coefficients in h are obtained from $$h=B^{31\ 1}.A \tag{37}$$

where $B^{31\ 1}$ is a (u+1) by (u+1) square matrix inverse of B and A is a (u+1) element column matrix. Thus the u+1 distinct filter coefficients of h for a polynomial $1+x^u$ are determined.

Each FIR filter may be independently designed using this result for each power of x in Equation (28), but from Equation (36) the terms of B[i,j] for j>0 and i>u are not zero so the result is still an approximation. The results are improved by finding the (u+1)th derivative of Equation (31), the first error term, as $$\operatorname{Err}[u]=B[u+1].h \tag{38}$$

where B[u+1] is the row u+1 in a vertically extended matrix B, i.e., the (u+1)th derivative of B[0]. This correction is added into the same term for the next larger u in Equation (33), which is twice the previous value of u from Equation (28), to derive the following modified form of Equation (33)

$$\begin{aligned} d^i/d\omega^i(1+((\omega-\omega_m)/(-\omega_t))^u) &= 0 & i > u \\ &= u!/(-\omega_t)^u - \operatorname{Err}[u/2] & i = u \\ &= 0 & 0 < i < u \\ &= 1 & i = 0 \end{aligned} \tag{39}$$

Note that Err[1/2]=0, i.e., there is no error term to compensate for when designing the first filter (u=1).

The integer parameter r, the register delay value, is chosen to give correctly functional filters for all r>0, and also may be chosen independently for each $u=2^P$ (P=0,1,2, ... F−1). This parameter affects the response of the filter as well as the filter complexity, so choosing a best value requires a hardware complexity metric and either a search or direct solution to obtain the best compromise in performance/hardware complexity. One such heuristic is $$\operatorname{Quality}[u]=1/(|\operatorname{Err}[u]|h_0 r[u]^2) \tag{40}$$

where higher Quality is better. In practice fairly small values of r[u] are optimal unless $\omega_m$ is very small.

Finally the number of filters, F, is determined. In practice the value of F depends strongly upon the in-band performance required, and the parameters $\omega_m$, $\omega_t$, $\omega_d$. Since r[u] is found in order of increasing u, the filters determined so far may be convolved with each new filter until the overall performance meets the frequency response requirements.

Thus the present invention provides digital FIR filters for compensation of Nyquist slope in pseudo-synchronous demodulators by providing a plurality of individual FIR filters coupled in series for processing an input bandpass filtered intermediate frequency video signal to produce a baseband video signal, each filter response representing respective product terms of the polynomial $A(\omega)=2(1+x)(1+x^2)\ldots(1+x^{2^{(F-1)}})$.

What is claimed is:

1. A finite impulse response (FIR) filter for compensation of Nyquist slope in a pseudo-synchronous demodulator comprising a plurality of individual FIR filters coupled in series having a bandpass filtered intermediate frequency video signal as an input to the first individual FIR filter in the series and a broadband video signal as an output from the last individual FIR filter in the series, the individual FIR filter amplitude responses representing respective product terms in the polynomial $$A(\omega)=2(1+x)(1+x^2)\ldots(1+x^{2^{(F-1)}})$$

where F is the number of individual FIR filters in the series and $X=(\omega_m-\omega/\omega_t$, $\omega_m$ being the modulation frequency and $\omega_t$ being a deviation frequency.

2. A method of designing a finite impulse response (FIR) filter for compensation of Nyquist slope in a pseudo-synchronous demodulator comprising the step of coupling a plurality of individual FIR filters in series, a bandpass filtered intermediate frequency video signal being input to the first individual FIR filter in the series and a broadband video signal being output from the last individual FIR filter in the series, the individual FIR filter amplitude responses representing respective product terms in the polynomial $$A(\omega)=2(1+x)(1+x^2)\ldots(1+x^{2^{(F-1)}})$$

where F is the number of individual FIR filters in the series and $x=(\omega_m-\omega/\omega_t$, $\omega_m$ being the modulation frequency and $\omega_t$ being a deviation frequency.

3. The method as recited in claim 2 further comprising the step of heuristically obtaining a register delay value for delay elements in each of the individual FIR filters; and determining the number of individual FIR filters F in the series by convolving each additional individual FIR filter with the preceding individual FIR filters until an overall performance meets a frequency response requirement.

* * * * *